(12) United States Patent
Brosh et al.

(10) Patent No.: US 6,765,438 B1
(45) Date of Patent: Jul. 20, 2004

(54) TRANSCONDUCTANCE POWER AMPLIFIER

(75) Inventors: Richard Brosh, Manassas, VA (US); Scott C. Willis, Manassas, VA (US)

(73) Assignee: Bae Systems Information and Electronic Systems Integration, Inc., Manassas, VA (US)

( * ) Notice: Subject to any disclaimer, the term of this patent is extended or adjusted under 35 U.S.C. 154(b) by 51 days.

(21) Appl. No.: 09/998,714

(22) Filed: Nov. 1, 2001

(51) Int. Cl.[7] .............................. H03F 1/24; H03F 1/36
(52) U.S. Cl. ........................ 330/100; 330/300; 330/311; 330/262; 330/285; 330/296
(58) Field of Search ................................ 330/100, 300, 330/311, 262, 285, 296

(56) References Cited

U.S. PATENT DOCUMENTS

| | | |
|---|---|---|
| 4,442,409 A | 4/1984 | Preslar |
| 4,482,868 A | 11/1984 | Whatley |
| 4,520,323 A | 5/1985 | Nakayama |
| 4,558,288 A | 12/1985 | Nakayama |
| 4,628,275 A | 12/1986 | Skipper et al. |
| 5,057,790 A | 10/1991 | Landi |
| 5,361,041 A | 11/1994 | Lish |
| 5,378,938 A * | 1/1995 | Birdsall et al. ............... 327/94 |
| 5,621,357 A | 4/1997 | Botti et al. |
| 5,841,321 A | 11/1998 | Miyake et al. |
| 5,955,923 A | 9/1999 | Dijkmans et al. |
| 6,150,853 A * | 11/2000 | Chrappan et al. ........... 327/108 |

FOREIGN PATENT DOCUMENTS

JP                62294306         *  3/1988

OTHER PUBLICATIONS

Millman "Microelectronics" McGraw–Hill Book Co 1979 pp 670–671.*
Elwan et al. "CMOS low–voltage class–AB operational transconductance amplifier" Electronics Letters, vol. 36 Issue 17 Aug. 17, 2000 pp 1439–1440.*

* cited by examiner

*Primary Examiner*—Michael Shingleton
(74) *Attorney, Agent, or Firm*—Simpson & Simpson, PLLC

(57) ABSTRACT

A transconductance power amplifier for amplifying a signal to a capacitive load, including a first N-channel enhancement MOSFET transistor operatively arranged to source current to the capacitive load, wherein the first N-channel MOSFET transistor has a threshold gate to source voltage, a second N-channel enhancement MOSFET transistor operatively arranged to sink current to the capacitive load, an operational amplifier operatively arranged to transmit and amplify an input signal to both of the first and second MOSFET transistors, and, means for biasing the first N-channel enhancement MOSFET transistor such that its gate to source voltage is always at or above its threshold when the load draws near zero current so that very little additional gate charge is required to turn it on more fully.

5 Claims, 1 Drawing Sheet

TRANSCONDUCTANCE POWER AMPLIFIER

FIELD OF THE INVENTION

The present invention relates generally to power amplifiers, more particularly to power amplifiers designed to drive capacitive loads, and, even more particularly, to a transconductance power amplifier.

BACKGROUND OF THE INVENTION

Many systems, including spacecraft, require power amplifiers to drive capacitive loads. Power amplifier electronics are commonly required in satellites for various servo control systems such as piezoelectric actuators for imaging applications. The high capacitance associated with piezoelectric actuators poses a challenge to maintaining stability and accuracy with conventional amplifier topologies. In addition, high voltage N-channel devices and low voltage operational amplifiers are more readily available in radiation hardened configurations than P-channel devices and high voltage operational amplifiers, respectively. There is thus a longfelt need for a transconductance power amplifier for capacitive loads that offers improved stability and accuracy.

SUMMARY OF THE INVENTION

The present invention broadly comprises a transconductance power amplifier for amplifying a signal to a capacitive load, including a first N-channel enhancement MOSFET transistor operatively arranged to source current to the capacitive load, wherein the first N-channel MOSFET transistor has a threshold gate to source voltage, a second N-channel enhancement MOSFET transistor operatively arranged to sink current to the capacitive load, an operational amplifier operatively arranged to transmit and amplify an input signal to both of the first and second MOSFET transistors, and, means for biasing the first N-channel enhancement MOSFET transistor such that its gate to source voltage is always at or above its threshold when the load draws near zero current so that very little additional gate charge is required to turn it on more fully. The power amplifier also includes means for reducing current to the first N-channel enhancement MOSFET transistor when the power amplifier sinks current from the load through the second N-channel enhancement MOSFET transistor.

A general object of the present invention is to provide a transconductance power amplifier for high capacitance loads, which amplifier offers improved stability and accuracy versus prior designs.

A secondary object of the present invention is to provide a transconductance power amplifier for capacitive loads having a pair of N-channel MOSFET drive transistors, one of which is biased such that its gate to source voltage is always at or above its threshold when the load draws near zero current so that very little additional gate charge is required to turn it on more fully.

Another object of the present invention is to provide a transconductance power amplifier for capacitive loads having a pair of N-channel MOSFET drive transistors, one of which sources current to the load while the other sinks current from the load, further including means for reducing current to the "sourcing" transistor when the other transistor is sinking current from the load.

A further object of the present invention is to provide a transconductance power amplifier which uses N-channel devices and a low voltage operational amplifier for radiation hardening.

Still a further object of the present invention is to provide a transconductance power amplifier which uses a minimum number (5) of active components.

These and other objects, features and advantages of the present invention will become readily apparent from the following detailed description of the invention in view of the drawing figure and appended claims.

DETAILED DESCRIPTION OF THE PREFERRED EMBODIMENT

Figure 1:
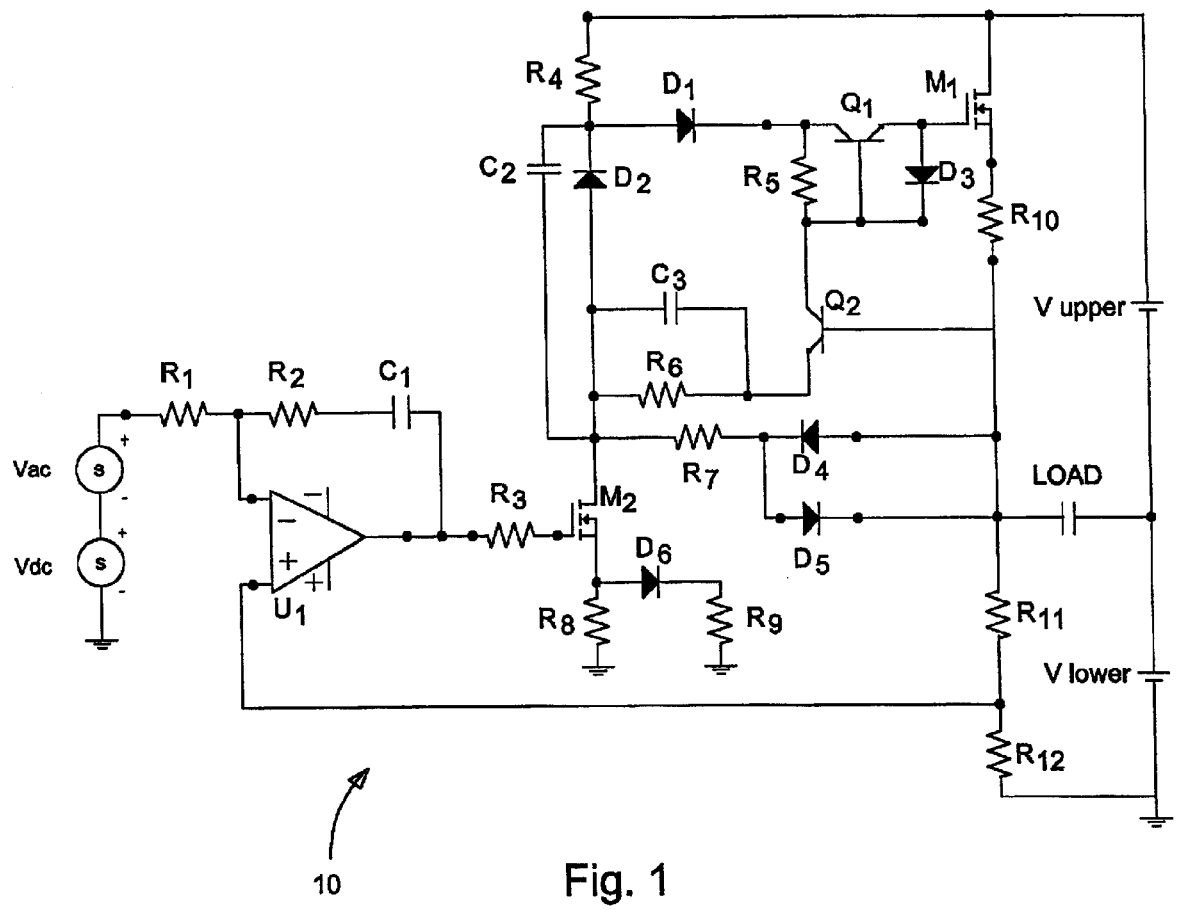
FIG. 1 is a schematic diagram of the transconductance power amplifier circuit of the invention.

The circuit diagram of the transconductance power amplifier of the present invention is shown in FIG. 1. Operation of the circuit is as follows:

In general, N-channel enhancement MOSFET $M_2$ sinks current from the load, LOAD, whereas N-channel enhancement MOSFET $M_1$ sources current to the load. Resistors $R_7$, $R_8$, $R_9$, and $R_{10}$ limit the current that can be provided to the load. In a preferred embodiment, $R_7$ has a value of 100 ohms, and limits the amount of sink current. Resistor $R_8$, tied to the source of $M_2$, limits the current through $M_2$ by the maximum output voltage of $U_1$ less the gate to source voltage, divided by the source resistance of $R_8$. $R_8$ causes a very fast change of drain to source voltage of $M_2$ with respect to current through $R_8$. Therefore, to reduce the sensitivity of $M_2$ to current, $D_6$ and a smaller resistance value, $R_9$, are arranged in parallel to $R_8$.

Similarly, resistor $R_{10}$ is included in the source of $M_1$. The current through $M_1$ is limited by $D_2$, a 15V Zener diode, less the gate to source voltage, divided by the resistance of resistor $R_{10}$.

In addition to limiting the current from the load, $R_7$ is part of the circuit that controls $M_1$ conduction under the following conditions:

1. If the power amplifier sinks current from the load through $M_2$, $Q_2$ is forward biased, then $M_1$ current is reduced because the gate source voltage of $M_2$ is reduced by the current $I_{CE}$, of $Q_2$. Diode $D_4$ compensates for the $V_{be}$ drop of $Q_2$ providing a more controlled response to gate to source voltage of $M_2$.
2. If the load current is near 0 amperes, $M_1$ is biased near its threshold voltage and conducts approximately 10 mA due to $D_2$, $M_1$ gate to source, and the current through $R_7$. $R_5$, a 100 ohm resistor in a preferred embodiment, and 10 k resistor, $R_6$, will nearly shut off $M_1$ when conducting approximately 100 uA; therefore, the current through the 100 ohm resistor, $R_7$, will be approximately 10 mA.

Note that the resistors provide both a current limit at maximum source/sink extremes, and negative feedback for controlled small signal transconductance gain in condition 2 where the load current is close to zero.

A 100 k ohm resistor, $R_4$, limits the current through $D_2$. The 0.1 uF capacitor, $C_2$, helps to maintain 15V across $D_2$. The diode, $D_1$, prevents a sneak path for the load current to flow through the low power devices, $Q_2$ and $Q_1$. The transistor, $Q_1$, provides an emitter follower stage to boost drive current to $M_1$. Diode $D_3$ prevents damage to $Q_1$ by limiting the reverse Vbe of $Q_1$. Similarly, diode $D_5$ prevents damage to $Q_2$. Capacitor, $C_3$, provides stability to the circuit.

In a preferred embodiment, operational amplifier (op amp) $U_1$, is a precision dual amplifier (such as AD648) that also has good radiation performance. The op amp is supplied by a low voltage source (i.e., <15V) though the transistor stage can be driven by high voltage (i.e., hundreds of volts).

An important advantage and feature of the present invention is that the gate to source voltage of the top transistor $M_1$ is always at or above its threshold when the load draws near zero current so that very little additional gate charge is required to turn it on more fully, yet the output current is controlled. Since the current through the capacitive load is controlled, the control loop dynamics are better than using voltage mode. Since the top transistor is always on, there is no crossover distortion compared to Class B amplifiers.

It should be apparent to those having ordinary skill in the art that changes and modifications to the circuit can be made without materially altering circuit operation. These changes include, for example:

Powering the amplifier with split supply voltages and referencing the load to a midpoint connection.

Changing ground reference and shifting drive signal with a level shifter.

Adding an additional amplifier to nearly eliminate DC offset.

Changing compensation and amplifier configuration.

Adding a protection diode to the op amp and decoupling.

Replacing zener diodes with $V_{be}$ multiplier transistor-resistor circuits.

Thus, it is seen that the objects of the invention are efficiently obtained, although it should be readily apparent to those having ordinary skill in the art that changes and modifications to the invention, such as those recited above, can be made to the circuit without departing from the scope and spirit of the claims.

We claim:

1. A transconductance power amplifier for amplifying a signal to a capacitive load, comprising:

only two N-channel MOSFET transistors, including;

a first N-channel enhancement MOSFET transistor operatively arranged to source current to said capacitive load, wherein said first N-channel MOSFET transistor has a threshold gate to source voltage;

a second N-channel enhancement MOSFET transistor operatively arranged to sink current to said capacitive load, said amplifier further comprising;

an operational amplifier arranged to transmit and amplify an input signal to both of said first and second MOSFET transistors; and, means for biasing said first N-channel enhancement MOSFET transistor such that its gate to source voltage is always at or above its threshold when the load draws near zero current so that very little additional gate charge is required to turn it on more fully.

2. The transconductance power amplifier for amplifying a signal to a capacitive load recited in claim 1 further comprising means for reducing current to said first N-channel enhancement MOSFET transistor when said power amplifier sinks current from the load through said second N-channel enhancement MOSFET transistor.

3. A transconductance power amplifier for amplifying a signal to a capacitive load, comprising:

only two N-channel MOSFET transistors, including;

a first N-channel enhancement MOSFET transistor operatively arranged to source current to said capacitive load;

a second N-channel enhancement MOSFET transistor operatively arranged to sink current to said capacitive load, said amplifier further comprising;

an operational amplifier arranged to transmit and amplify an input signal to both of said first and second MOSFET transistors; and, means for reducing current to said first N-channel enhancement MOSFET transistor when said power amplifier sinks current from the load through said second N-channel enhancement MOSFET transistor.

4. A transconductance power amplifier for amplifying a signal to a capacitive load, comprising:

a maximum of five (5) active components, including;

a first N-channel enhancement MOSFET transistor operatively arranged to source current to said capacitive load, wherein said first N-channel MOSFET transistor has a threshold gate to source voltage;

a second N-channel enhancement MOSFET transistor operatively arranged to sink current to said capacitive load, said amplifier further comprising;

an operational amplifier arranged to transmit and amplify an input signal to both of said first and second MOSFET transistors; and, means for biasing said first N-channel enhancement MOSFET transistor such that its gate to source voltage is always at or above its threshold when the load draws near zero current so that very little additional gate charge is required to turn it on more fully.

5. The transconductance power amplifier recited in claim 4 wherein said power amplifier comprises a single operational amplifier, only two MOSFET transistors, and only two bipolar transistors.

* * * * *